United States Patent [19]

Evans

[11] 4,295,099
[45] Oct. 13, 1981

[54] PEAK DETECTOR
[75] Inventor: Thomas E. Evans, Parker, Colo.
[73] Assignee: Honeywell Inc., Minneapolis, Minn.
[21] Appl. No.: 72,572
[22] Filed: Sep. 5, 1979
[51] Int. Cl.³ ............................................ H03K 5/153
[52] U.S. Cl. .................................... 328/151; 307/351; 307/353; 324/103 P; 328/117
[58] Field of Search ................ 307/351, 353; 328/114, 328/117, 116, 151, 132; 324/103 P

[56] References Cited
U.S. PATENT DOCUMENTS 3,851,260 11/1974 Colin ............................... 307/353 X
4,039,858 8/1977 Stewart ........................... 307/353 X
4,053,840 10/1977 Baron ............................. 307/353 X

*Primary Examiner*—John Zazworsky
*Attorney, Agent, or Firm*—L. J. Marhoefer; L. D. Button

[57] ABSTRACT

A peak detecting circuit includes apparatus wherein an analog input signal is applied to a pair of sample and hold circuit elements with the output of the two sample and hold circuits connected, respectively, to the two input terminals of a voltage level comparator. The output of the comparator changes phase when a peak value occurs in the input analog signal. The output of the comparator is then applied to the input of the phase change detector which, in turn, produces an output signal whenever the comparator indicates that a peak has occurred in the analog input signal.

8 Claims, 2 Drawing Figures

PEAK DETECTOR

BACKGROUND OF THE INVENTION

The present invention relates to signal responsive circuits. More particularly, it relates to a signal peak detector circuit.

In electronic measuring or control systems, it is often desirable or necessary to be able to detect when a peak value of a measured variable occurs. Heretofor, there have been a number of different schemes provided for detecting peak values of analog signals. In one form of such previous peak detector schemes, the peak detecting circuit is in the nature of an integrator. One of the disadvantages of this type of circuit is that integrators have a tendancy to drift. When means have been provided on such previous peak detector to overcome or compensate for the drift, the additional features, have, of necessity, added significant expense to the overall circuit. Further, it has been found that a switched or chopped input data signal could not be satisfactorily used with such previous peak detector circuits.

SUMMARY OF THE INVENTION

It is, accordingly, an object of the present invention to provide an improved peak detector which overcomes the deficiencies of the previous apparatus, which is relatively inexpensive to produce, is simple in construction in operation, and which may be used with either continuous or chopped analog input signals.

In accomplishing these and other objects, there has been provided in accordance with the present invention, an improved peak detecting circuit wherein an analog input signal is applied to a pair of sample and hold circuit elements with the output of the two sample and hold circuits connected, respectively, to the two input terminals of a voltage level comparator. The output of the comparator changes phase when a peak value occurs in the input analog signal. The output of the comparator is then applied to the input of the phase change detector which, in turn, produces an output signal whenever the comparator indicates that a peak has occurred in the analog input signal.

BRIEF DESCRIPTION OF THE DRAWINGS

A better understanding of the present invention may be had from the following detailed description when read in the light of the accompanying drawings in which.

DETAILED DESCRIPTION

Figure 1:
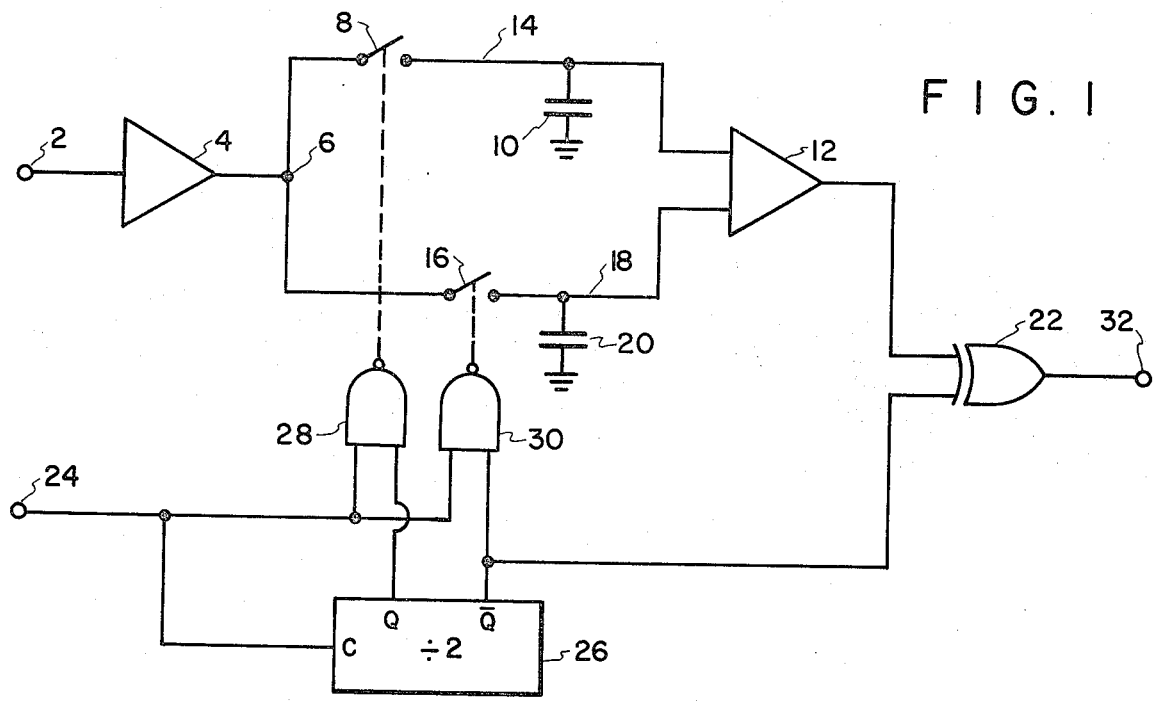
FIG. 1 is a schematic block diagram of a peak detector circuit embodying the present invention.

Referring now to the drawings in more detail, the peak detector shown in FIG. 1 includes an input terminal 2 connected to the input of a buffer amplifier 4. The output of the buffer amplifier 4 is connected to a junction 6. From the junction 6, there are two parallel paths for the output signal from the buffer amplifier. A first path includes a switch member 8 and a storage capacitor 10. The switch 8 is connected in series between the junction 6 and a first input terminal of a voltage level comparator 12. A lead 14 is connected between the switch 8 and the comparator 12. The capacitor 10 is connected between the lead 14 and ground. Similarly, the other path includes a switch member 16 connected between the junction 6 and a second input terminal of the comparator 12. A lead 18 is connected between the switch 16 and the comparator 12. A second storage capacitor 20 is connected between the lead 18 and ground. The output terminal of the comparator 12 is connected to one input terminal of a 2 terminal EXCLUSIVE OR gate 22.

A second input terminal 24 is arranged to receive a clock signal. The terminal 24 is connected to the clock or toggle input of a divided-by-two counter which may be in the form of a flip-flop 26. The terminal 24 is also connected to one input terminal of each of two NAND gates 28 and 30. The second input terminal of the NAND gate 28 is connected to the Q output of the flip-flop 26. Similarly, the second input terminal of the NAND gate 30 is connected to the Q output of the flip-flop 26. The output of the flip-flop 26 is also connected to the second input terminal of the EXCLUSIVE OR gate 22. The output of the EXCLUSIVE OR gate 22 is connected to an output terminal 32.

The output of the NAND gate 28 is connected to actuate the switch member 8. Similarly, the output of the NAND gate 30 is connected to actuate the switch member 16. While these two switch members are illustrated symbolically as generic switches, they and preferably are solid state switch elements and may be of the type designated Signetics DG200. The output signals from the respective NAND gates 28 and 30 effect a momentary closure of the two switches, respectively.

Figure 2:
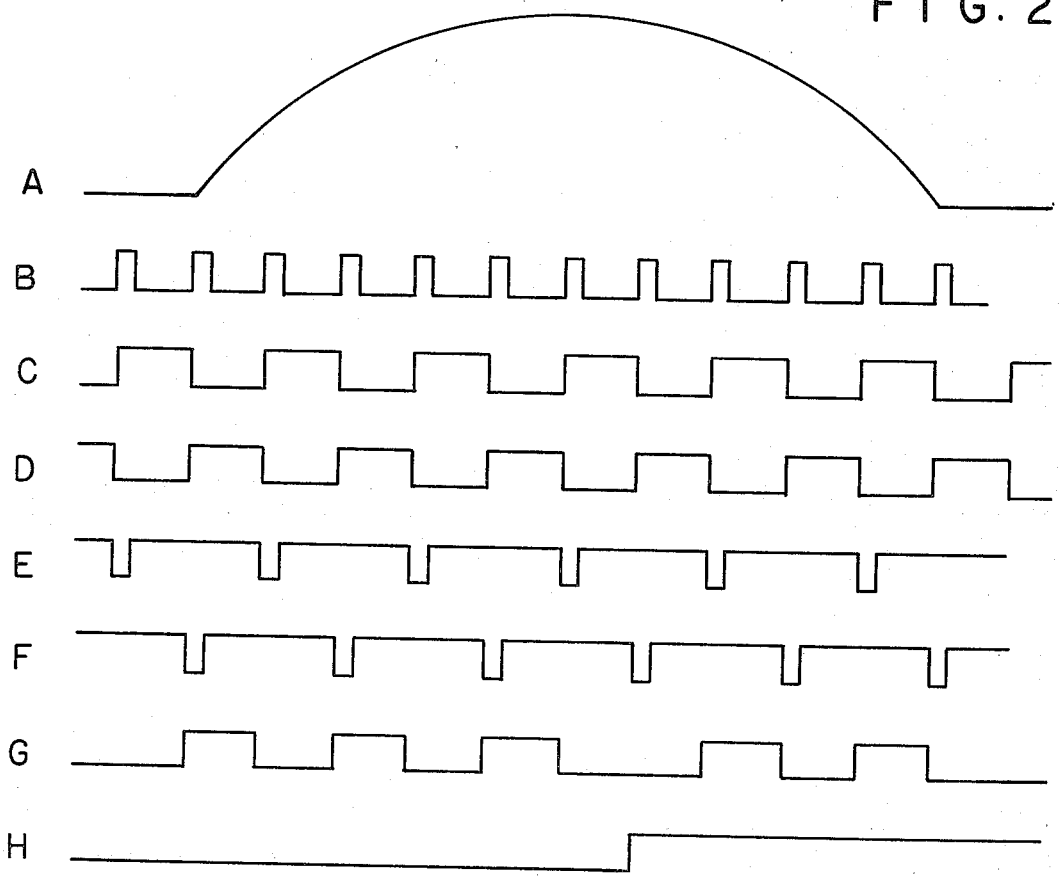
FIG. 2 is a table of wave shapes representing signals at various points in the circuit shown in FIG. 1.

In considering the operation of the circuits shown in FIG. 1, reference may also be had to the wave shapes shown in FIG. 2. It will be appreciated, of course, that the illustrated wave shapes are not drawn to scale but are illustrative of the underlying principle. In FIG. 2, Line A is representative of a signal which may be applied to the analog input terminal 2. Line B, on the other hand, is representative of the clock or timing signals applied to the input terminal 24. Line C is representative of the Q output of the flip-flop 26. Line D is representative of the "Q" output of the flip-flop 26. The line D is also representative of the ENABLE signal applied to the second input terminal of the EXCLUSIVE OR gate 22. Line E is representative of the output of the NAND gate 28 and, hence of the closure of the switch member 8. Line F is representative of the output of the NAND gate 30 and, hence, of the closure of the switch 16. Line G is representative of the output of the comparator 12. Line H is representative of the output signal appearing at the output terminal 32.

The signal applied to the input terminal 2 is a relatively slow signal with the curve shown representing a typical signal which may be of about 5 milliseconds duration. In a circuit constructed in accordance with the present invention, the clock signals applied to the input terminal 24 are of about 20 kilohertz repetition rate with a low duty cycle positive pulse having a duration of about two microseconds. These pulses applied to the clock input of the flip-flop 26, cause the Q and Q output terminals to be alternately triggered to a logically high state as indicated in lines C and D, respectively, of FIG. 2. Since the gate 28 is enabled by the clock pulses illustrated in line B of FIG. 2, the output pulses from the gate 28 will be a series of negative pulses of duration comparable to that of the clock pulses and occuring at half the repetition frequency of the clock pulses, occurring, so to speak, in synchronism with the odd pulses of the clock pulse train. Similarly, the gate 30 is enabled by the clock pulses; therefore, the output signals from that gate will also be a series of short duty cycle, negative pulses synchronized with the even pulses of the clock train. These output pulses of the gates 28 and 30 are schematically represented in lines E and F of FIG. 2. As was previously mentioned, the switches 8 and 16 are preferably solid state switching devices. In the exemplary switch devices hereinbefore noted, the switches are closed by a logical "0" and opened by a logical "1". Thus, the switch 8 will be closed on each of the negative going pulses illustrated in line E of FIG. 2. Similarly, the switch 16 will be closed by each of the negative going pulses of line F of FIG. 2. Again, in the illustrative embodiment, the switch closures occur alternately and each switch being actuated at a repetition rate of 10 kilohertz.

For each closure of the switch 8, a sample of the instantaneous value of the analog input signal is stored on the capacitor 10 and a similar sample of the instantaneous value of the input analog signal is stored on the capacitor 20 for each closure of the switch 16. Since the switches 8 and 16 close on alternate pulses of the clock pulse train, while the analog input signal is changing in value, the samples stored on the capacitors 10 and 20 will alternate with the greater magnitude signal being on first one and then the other of these two capacitors so long as the change and the magnitude of the analog input signal is in a constant direction. These two signals applied, respectively, to the two input terminals of the comparator 12 cause the output of the comparator to alternate between a high and low value output as shown on the first half of the line G of FIG. 2. For example, if the value of the analog input signal were changing in a positive direction, by inversion in the buffer amplifier, the signals applied to the junction 6 would be a decreasing signal. When that signal is sampled by the alternate sampling as hereinbefore described, if it is assumed that the first sample is applied to the capacitor 10 and the the second sample applied to the capacitor 20, it would be seen that, at the time of the second sample, the larger value would be stored on the capacitor 10 and the output of the comparator 12 would be at a high level. When the third sample is now applied to the capacitor 10, that value will be less than the value stored on the capacitor 20 and the output of the comparator 12 will be switched to a low value. Thus, the output of the comparator 12 would continue to be switched back and forth between a high value and a low value on each successive sample applied alternately to the two capacitors 10 and 20 until such time as a peak value is reached.

When the peak value is reached, the phase relationship of the magnitude of the signals applied to the capacitors 10 and 20 is reversed producing a corresponding change in the phase relationship of the output of the comparator 12 as illustrated in the second portion of line G of FIG. 2. Since the output of the comparator 12 is applied to one input terminal of the EXCLUSIVE OR gate 22 and the Q output of the flip-flop 26 is applied to the other input terminal of the EXCLUSIVE OR gate 22, the signals represented on lines D and G of FIG. 2 should be compared. It will be noted that the signals represented by the first half of line G are in phase with the signals represented by line D, FIG. 2. Since the gate 22 is an EXCLUSIVE OR gate, the in phase relationship of the signals applied thereto produce a logical "low" output signal as indicated by the first half of line H, FIG. 2. When, however, a peak value is reached and a change in phase relationship occurs at the output of the comparator, as indicated in the second half of line G, FIG. 2, the signals represented by line G are then out of phase with the signals represented by line D. The out of phase relationship of the two signals applied to the input terminals of the gate 22 produces a logical "high" output signal from that gate 22. Thus, the change from a logical "low" to a logical "high" at the output of the gate 22, applied to the output terminal 32, is representative of the occurrence of the peak value of the input analog signal.

In the illustration of the relationships of the various signals as shown in FIG. 2, it is seen that the output signal indication of the occurrence of the peak value of the input analog signal occurs on the occasion of the first pulse following the actual peak value. It will be recalled that it was hereinbefore mentioned that the signals represented in FIG. 2 are not drawn to scale. Thus, while the clock pulses of line D appear relatively widely spaced, in the exemplary embodiment, these pulses occurred at the repetition rate of 20 kilohertz. Accordingly, it will be seen, that the output pulse indicative of the time of the peak value will occur at approximately 50 microseconds after the actual peak. When the analog input signal is a slowly changing value, as, for example, 5 milliseconds for the changing portion of the curve shown in FIG. A, the 50 microsecond delay is relatively insignificant and renders the output signal substantially synchronous with the occurrence of the peak value.

In one circuit constructed in accordance with the present invention, the analog input signal was a signal which was, in fact, chopper modulated. When the modulation of the analog signal is accomplished synchronously with the clock signals represented by line B of FIG. 2, the peak detector illustrated in FIG. 1 is transparent to the modulation. The rising and falling values of the analog signal will then by synchronous with the actuation of the sampling switches 8 and 16. Thus, the peak detector is transparent to the modulation of the analog signal and the peak detector operates as heretofor described, unencumbered with the modulation.

Thus, there has been provided, in accordance with the present invention, the peak detector for analog input signals which is free from drift, is simple in construction and operation, is relatively inexpensive, and provides a reliable and accurate indication of the occurrence of a peak value in an input analog signal.

The embodiments of the invention in which an exclusive property or privilege is claimed are defined as follows:

1. A peak detector circuit comprising:
   input signal terminal means for connection to a source of analog signals,
   a first and second sample holding means,
   means connected to said input terminal means for applying successive samples of said analog signals to said first and second holding means alternately,
   comparator means connected to compare the magnitude of said signals stored in said holding means to produce a phase change signal on the occurrence of a peak value of said analog signal, and
   means connected to be responsive to said phase change signal from said comparator means to produce an output signal indicative of the occurrence of said peak value.

2. A peak detector circuit as set forth in claim 1 wherein said means connected to said input terminal means comprises a first and a second switching means, said first switching means being connected between said terminal means and said first sample holding means, said second switching means being connected between said input terminal means and said second sample holding means.

3. A peak detector circuit as set forth in claim 2 wherein said first and second switching means are solid-state switching devices.

4. A peak detector circuit as set forth in claim 3 and including a control signal input means and control means connected to said first and second switching means responsive to the control signal for actuating said first and second switching means alternately.

5. A peak detector circuit as set forth in claim 3 and including a control signal input terminal for connection to a source of control pulses, a flip-flop circuit means having at toggle input connected to said control signal input terminal, said flip-flop circuit means having first and a second output terminal toggled into alternate energization responsive to said control signals, a first and second gate means each connected to be enabled by said control pulses and to be triggered, respectively, by said flip-flop circuit means, said first gate means having an output connected to control the actuation of said first switching means and said second gate means having an output connected to control the actuation of said second switching means.

6. A peak detector circuit as set forth in claim 5 wherein said means responsive to said phase change signal comprises a phase comparator having a first input connected to an output terminal of said comparator means and a second input connected to said second output terminal of said flip-flop circuit means for comparing the phase relationship of said signals input thereto and to produce an output signal in repsonse to a predetermined phase relationship.

7. A peak detector circuit at set forth in claim 6 wherein said predetermined phase relationship is a relationship of phase opposition.

8. A peak detector circuit as set forth in claim 6 wherein said phase comparator comprises an EXCLUSIVE OR gate.

* * * * *